(12) United States Patent
Beermann et al.

(10) Patent No.: US 12,057,855 B2
(45) Date of Patent: Aug. 6, 2024

(54) CIRCUIT FOR CONVERTING A SIGNAL BETWEEN DIGITAL AND ANALOG

(71) Applicant: Advantest Corporation, Tokyo (JP)

(72) Inventors: Andreas Beermann, Stuttgart (DE);
Martin Mücke, Stuttgart (DE);
Christian Volmer, Stuttgart (DE)

(73) Assignee: Advantest Corporation, Tokyo (JP)

( * ) Notice: Subject to any disclaimer, the term of this patent is extended or adjusted under 35 U.S.C. 154(b) by 75 days.

(21) Appl. No.: 17/733,203

(22) Filed: Apr. 29, 2022

(65) Prior Publication Data

US 2022/0263515 A1  Aug. 18, 2022

Related U.S. Application Data

(63) Continuation of application No. PCT/EP2020/060142, filed on Apr. 9, 2020.

(51) Int. Cl.
*H03M 1/66* (2006.01)
*H03M 1/06* (2006.01)

(52) U.S. Cl.
CPC .................. *H03M 1/0617* (2013.01)

(58) Field of Classification Search
CPC ........................... H03M 1/0617; H03M 1/0624
USPC .................................................. 341/144, 111
See application file for complete search history.

(56) References Cited

U.S. PATENT DOCUMENTS

| | | | |
|---|---|---|---|
| 5,509,038 A | 4/1996 | Wicki | |
| 7,242,737 B2 | 7/2007 | Lake et al. | |
| 8,929,298 B2 | 1/2015 | Yi et al. | |
| 10,454,667 B2 | 10/2019 | Lee et al. | |
| 2007/0053474 A1* | 3/2007 | Kim | H04L 69/28 375/356 |
| 2018/0083642 A1 | 3/2018 | Zerbe et al. | |
| 2018/0115406 A1 | 4/2018 | Moore et al. | |
| 2021/0044417 A1 | 2/2021 | Stott et al. | |

OTHER PUBLICATIONS

Texas Instruments: "DAC5670-SP 14-BIT 2.4-GSPS Digital-to Analog Converter", May 31, 2013 (May 31, 2013), XP055758395.
Matthew T Hunter et al: "A novel Farrow Structure with reduced complexity", Circuits and Systems, 2009. MWSCAS '09. 52nd IEEE International Midwest Symposium on, IEEE, Piscataway, NJ, USA, Aug. 2, 2009 (Aug. 2, 2009), pp. 581-585, XP031528091, ISBN: 978-1-4244-4479-3 ; (Abstract provided via https://stars.library.ucf.ede/scopus2000;2 pages).

* cited by examiner

*Primary Examiner* — Peguy Jean Pierre

(57) ABSTRACT

An electronic circuit for converting a signal between digital and analog in a burst mode, including a processor configured to utilize a synchronizing clock signal, a converter configured to convert a signal data between digital and analog using a converter clock signal, a phase comparator configured to determine a phase relationship between the synchronizing clock signal and the converter clock signal, and a digital signal processor coupled to the phase comparator and configured to receive an information about the phase relationship, wherein the digital signal processor is configured to apply a delay to the signal data being exchanged between the processor and. The synchronizing clock signal and the converter clock signal have a predetermined frequency relationship.

20 Claims, 8 Drawing Sheets

CIRCUIT FOR CONVERTING A SIGNAL BETWEEN DIGITAL AND ANALOG

RELATED APPLICATION(S)

The present Application is a Continuation of and claims priority to co-pending, commonly owned PCT Application Number PCT/EP2020/060142 to Applicant Advantest Corporation, filed 9 Apr. 2020, which is hereby incorporated herein by reference in its entirety.

TECHNICAL FILED

The present invention relates to a circuit for converting a signal between digital and analog, a test apparatus for testing a device under test, and a method for converting a signal between digital and analog.

BACKGROUND OF THE INVENTION

As an operation rate of state-of-the-art devices increases, the challenge of evaluating the performance of such devices in production-scale quantities becomes progressively more difficult. One difficulty seems from conventional modes of testing high speed devices, which, at higher frequencies, tend to reflect the combined performance of the device under test (DUT) and the test hardware, rather than the performance of the DUT alone.

When testing high speed and high performance devices in the GHz (gigahertz) frequency range, the limiting factor for performance on conventional automatic test equipment (ATE) may be determined more and more by jitter in the stimulus and conversion (sampling) clock signal of the analog-to-digital-converters (ADCs) and digital-to-analog-converters (DACs) that are part of the test hardware. Jitter is the time variation of a periodic signal, often in relation to a reference clock source. Jitter may be observed in characteristics such as a frequency of successive pulses, or a phase of periodic signals. In respect to performance of ATE, however, a common assumption is that the limiting effect is caused by jitter in the conversion clock alone. Therefore, high costs and high development efforts are commonly expended in providing ultra-low jitter clocks, e.g., by developing low-jitter clock generators incorporating sophisticated phase-locked-loop (PLl) architectures.

Recently, ADCs and DACs are produced for continuous operation on a fixed sample rate. For example, when ADCs and DACs are used in continuous mode, the converter sample rate is locked to the data rate with a PLL. All frequencies for converting the signals are usually known and therefore, it is possible to use the digital signal processor (DPS) to convert from an arbitrary user data rate to the converter rate. It is possible to do the same in burst mode, for example shown as FIG. 8. However, it is required to setup the PLL before each measurement in order to align the clock timing as shown in FIG. 9. For example, it is required to achieve accurate timing of the burst in a sub-converter-rate resolution.

Conventional circuits for converting a signal, for example, a circuit shown in FIG. 8 as a diagram requires one PLL for each channel. The simplest configuration of the PLL comprises a phase comparator, a loop filter and a voltage controlled oscillator; however, in general, PLL requires special and expensive external components. In addition, low jitter PLL cannot be integrated on CMOS process and therefore, PLLs consume a lot of board space. The time required for the PLL to settle before each burst is also an issue on ATE, where testing often consists of a large number of relatively short bursts.

SUMMARY OF THE INVENTION

Hence, it is an object of the present invention to provide an improved concept for a circuit for converting a signal in a burst mode.

According to a first aspect of the present application, a circuit for converting a signal between digital and analog, e.g., between a digital representation and an analog representation, e.g., from a digital representation to an analog representation or from an analog representation to a digital representation, the circuit including: a processor configured to provide or use a synchronizing clock signal, e.g. which is a clock signal to indicate a timing for outputting data based on an input data value associated with a sample time on a time grid or time axis, e.g. equally spaced in terms of time; a converter configured to convert a data between digital and analog using a converter clock signal, e.g. which is a clock signal to indicate a timing for receiving a piece of data provided from the processor and/or define a time when conversion between digital and analog is executed; a phase comparator, e.g. coupled to the processor to receive the synchronizing clock signal, and coupled to the converter to receive the converter clock signal, wherein the phase comparator is configured to determine a phase relationship between the synchronizing clock signal and the converter clock signal, e.g. the phase comparator is configured to perform comparison of timing of a rising edge or a falling edge between the synchronizing clock signal and the converter clock signal, thereby performing phase comparison between the signals; and a digital signal processor coupled to the phase comparator to receive an information about the phase relationship, e.g. phase difference between the synchronizing clock signal and the comparator clock signal, wherein the digital signal processor is configured to apply a delay to a signal data, e.g. time discrete output value associated with a different sample time, e.g. not on the original time grid or time axis, exchanged between the processor and the converter, e.g. in order to at least partially compensate for a phase difference between the synchronizing clock signal and the converter clock signal, in dependence of the phase relationship, wherein there is a predetermined frequency relationship between the synchronizing clock signal and the converter clock signal, e.g. which is locked at the predetermined value.

According to embodiments of the present application, the circuit is configured to decide, on the basis of an information about the phase relationship between the synchronizing clock signal and the converter clock signal, whether an enable signal triggering a conversion of data between digital and analog, which is in temporal synchronism with the synchronization clock signal, is sampled at a rising edge or at a falling edge of the converter clock signal, in order to obtain an enable signal which is in temporal synchronism with the converter clock signal.

According to the embodiments of the present application, the circuit is configured to select, in dependence on the information about the phase relationship between the synchronizing clock signal and the converter clock signal, between a first mode, in which the enable signal triggering a conversion of data between digital and analog, which is in temporal synchronism with the synchronization clock signal, is sampled at edges of a first edge type, e.g. at falling edges, of the converter clock signal, to obtain an intermediate signal, and in which the intermediate signal is sampled at edges of a second edge type, e.g. rising edges, of the converter clock signal, to obtain the enable signal which is in temporal synchronism with the converter clock signal, and a second mode, in which the enable signal triggering a conversion of data between digital and analog, which is in temporal synchronism with the synchronization clock signal, is sampled at edges of the second edge type of the converter clock signal, to obtain the enable signal which is in temporal synchronism with the converter clock.

According to the embodiments of the present application, the circuit includes: a first flip-flop circuit coupled to the processor to receive an enable signal, e.g. which is a test signal on a different clock domain as the converter clock signal and provided from the processor for aligning the output timing of the signal data, wherein the first flip-flop circuit is configured to sample the enable signal at a first sampling phase, when the phase relationship indicates that a value of a phase difference between the synchronizing clock signal and the converter clock signal is in a first predetermined range, e.g. smaller than a predetermined value, in case the phase difference has a potential risk to lead to metastability, the phase of sampling the enable signal is inverted to move sampling time instances away from clock edges of the synchronization clock signal, to obtain a sampled signal; a signal selector coupled to the processor to receive the enable signal and coupled to the first flip-flop circuit to receive the sampled signal, wherein the signal selector is configured to select one of the received signals, e.g. in dependence on the phase relationship, to obtain a selected signal; a second flip-flop circuit coupled to the signal selector to receive the selected signal, wherein the second flip-flop circuit is configured to sample the enable signal at a second sampling phase, when the phase relationship is in a second predetermined range, e.g. which is different from the first predetermined range and typically non-overlapping with the first predetermined range, and which may, for example, indicate that a value of a phase difference between the synchronizing clock signal and the converter clock signal is larger than a predetermined value; in this case, the edge of the sampled signal is synchronized with the converter clock signal, e.g. output timing of the signals are aligned and therefore, it is not necessary to align the rising timing of the clock signal; and a first-in-first-out circuit coupled to the digital signal processor to receive the signal data, and coupled to the second flip-flop circuit via a delay circuit, e.g. which calculates delay time based on the phase difference between the enable signal and the converter clock signal, to receive a delayed version of an output signal of the second flip-flop circuit, e.g. which indicates a signal data output timing of the converter, wherein the first-in-first-out circuit provides signal data associated with the sampled enable signal to the converter.

According to the embodiments of the present application, the selector includes a multiplexer, wherein the multiplexer selects one of input signals based on the information about the phase relationship. In addition, the phase comparator includes a phase-to-digital converter, wherein the phase-to-digital converter is configured to measure a phase difference between the synchronizing clock signal and the converter clock signal for determining the phase relationship. Furthermore, the digital signal processor, e.g. a fractional delay filter, is configured to counteract and/or at least partially compensate a phase difference between the synchronizing clock signal and the converter clock signal.

According to the embodiments of the present application, the digital signal processor, e.g. a fractional delay filter, is configured to provide a filtered data value associated with a conversion time in a time grid determined by the converter clock signal, e.g. signal sample, which is actually digital-to-analog converted by the converter at a time determined by the converter clock signal, on the basis of one or more input data values provided in synchronism with the synchronizing clock signal, e.g. one or more signal samples provided by the processor which should be digital-to-analog converted at times determined by the synchronizing clock signal, which is, not possible due to the time shift/phase shift between the synchronizing clock signal and the converter clock signal; and/or wherein the digital signal processor, e.g. a fractional delay filter, is configured to provide filtered data values aligned to a time axis determined by the synchronizing clock signal on the basis of one or more data values defined in a time grid determined by the converter clock signal, e.g. one or more signal samples which have actually been analog-to-digital converted by the converter at times determined by the converter clock signal, but which should have been analog-to-digital converted at times determined by the synchronizing clock signal, which is, however, not possible due to the time shift/phase shift between the synchronizing clock signal an the converter clock signal.

According to the embodiments of the present application, the digital signal processor or the fractional delay filter uses a Farrow structure. But any other suitable means for implementing a delay is permissible. The circuit includes an oscillator, wherein an output signal of the oscillator is used as the converter clock signal or wherein the circuit is configured to derive the converter clock signal from the output signal of the oscillator. The circuit is configured to derive the synchronizing clock signal and the converter clock signal from a common reference signal, such that frequencies of the synchronizing clock signal and of the converter clock signal are in a predetermined relationship. The converter is a digital-to-analog or an analog-to-digital converter.

According to a second aspect of the present application, a test apparatus for testing a device under test, including the circuit according to the present application. The test apparatus is configured to perform, e.g. start a test flow, e.g. a test flow using multiple channel modules providing signals to the device under test and evaluating signals received from a device under test, in synchronism with the synchronizing clock signal. The test apparatus is configured to provide an analog signal obtained using the converter on the basis of input signal values, e.g. provided by the processor, to the device under test, e.g. thereby stimulating the device under test, and/or wherein the apparatus is configured to obtain digital data provided by the digital signal processor on the basis of a digitized device-under-test signal obtained from the converter using the delay and to evaluate the digital data, e.g. to characterize the device under test.

According to a third aspect of the present application, a method for converting a signal between digital and analog, the method including: receiving a synchronizing clock signal provided from a processor or used by a processor and a converter clock signal used by a converter; determining a phase relationship between the synchronizing clock signal and the converter clock signal; and applying a delay to a signal data exchanged between the processor and the converter based on the phase relationship between the synchronizing clock signal and the converter clock signal, wherein there is a predetermined frequency relationship between the synchronizing clock signal and the converter clock signal.

According to an embodiment of the present application, the method includes; selecting, in dependence on the phase relationship between the synchronizing clock signal and the converter clock signal, between a first mode, in which the enable signal triggering a conversion of data between digital and analog, which is in temporal synchronism with the synchronization clock, is sampled at edges of a first edge type of the converter clock, to obtain an intermediate signal, and in which the intermediate signal is sampled at edges of a second edge type of the converter clock, to obtain the enable signal which is in temporal synchronism with the converter clock, and a second mode, in which the enable signal triggering a conversion of data between digital and analog, which is in temporal synchronism with the synchronization clock, is sampled at edges of the second edge type of the converter clock, to obtain the enable signal which is in temporal synchronism with the converter clock; and providing the signal data associated with the sampled enable signal to the converter.

According to a fourth aspect of the present application, computer program is provided, wherein the computer program is configured to implement the above described method, when being executed on a computer or micro controller, so that the above described method is implemented by the computer program.

According to embodiments, an electronic circuit for converting a signal between digital and analog in a burst mode includes a processor configured to utilize a synchronizing clock signal, a converter configured to convert a signal data between digital and analog using a converter clock signal, a phase comparator configured to determine a phase relationship between the synchronizing clock signal and the converter clock signal, and a digital signal processor coupled to the phase comparator and configured to receive an information about the phase relationship, wherein the digital signal processor is configured to apply a delay to the signal data being exchanged between the processor and the converter, wherein the delay is in dependence of the relationship. The synchronizing clock signal and the converter clock signal have a predetermined frequency relationship.

Embodiments include the above and further include wherein the converter is configured to determine, on the basis of the information about the phase relationship between the synchronizing and converter clock signals, on which edge an enable signal is sampled that triggers a conversion of data between digital and analog, which is in temporal synchronism with the synchronization clock signal, as between at a rising edge and a falling edge of the converter clock signal, in order to obtain an enable signal which is in temporal synchronism with the converter clock signal.

Embodiments include the above and further include wherein the converter is configured to select, based on the information about the phase relationship between the synchronizing clock signal and the converter clock signal, between operation in a first mode, in which the enable signal triggering a conversion of data between digital and analog, which is in temporal synchronism with the synchronization clock signal, is sampled at edges of a first edge type of the converter clock signal, to obtain an intermediate signal, and in which the intermediate signal is sampled at edges of a second edge type of the converter clock signal, to obtain the enable signal which is in temporal synchronism with the converter clock signal, and a second mode, in which the enable signal triggering a conversion of data between digital and analog, which is in temporal synchronism with the synchronization clock signal, is sampled at edges of the second edge type of the converter clock signal, to obtain the enable signal which is in temporal synchronism with the converter clock.

Embodiments include the above and further include a first flip-flop circuit coupled to the processor and configured to receive an enable signal, wherein the first flip-flop circuit is configured to sample the enable signal at a first sampling phase, wherein the phase relationship indicates that a value of a phase difference between the synchronizing and converter clock signals are in a first predetermined range, to obtain a sampled signal, a signal selector coupled to the digital signal processor and configured to receive the enable signal and further coupled to the first flip-flop circuit to receive the sampled signal, wherein the signal selector is configured to select one of the received signals to obtain a selected signal, a second flip-flop circuit coupled to the signal selector and configured to receive the selected signal, wherein the second flip-flop circuit is configured to sample the enable signal at a second sampling phase, wherein the phase relationship is in a second predetermined range, and a first-in-first-out circuit coupled to the digital signal processor to receive the signal data, and coupled to the second flip-flop circuit via a delay circuit to receive a delayed version of an output signal of the second flip-flop circuit. The first-in-first-out circuit is operable to provide signal data associated with the sampled enable signal to the converter.

Embodiments include the above and further include wherein the selector includes a multiplexer, configured to select one of input signals based on the information about the phase relationship.

Embodiments include the above and further include wherein the phase comparator includes a phase-to-digital converter, and wherein the phase-to-digital converter is configured to measure a phase difference between the synchronizing clock signal and the converter clock signal for determining the phase relationship.

Embodiments include the above and further include wherein the digital signal processor is configured to counteract and at least partially compensate for a phase difference between the synchronizing clock signal and the converter clock signal.

Embodiments include the above and further include wherein the digital signal processor is configured to provide a filtered data value associated with a conversion time in a time scale determined by the converter clock signal on the basis of one or more input data values provided in synchronism with the synchronizing clock signal, and wherein the digital signal processor is configured to provide filtered data values aligned to a time scale determined by the synchronizing clock signal on the basis of one or more data values defined in a time scale determined by the converter clock signal.

Embodiments include the above and further include wherein the digital signal processor includes a finite impulse response (FIR) filter.

Embodiments include the above and further include wherein the digital signal processor includes a Farrow structure.

Embodiments include the above and further include an oscillator, wherein the converter clock signal is derived from an output signal of the oscillator.

Embodiments include the above and further include wherein the synchronizing clock signal and the converter clock signal are derived from a common reference signal. The frequencies of the synchronizing clock signal and of the converter clock signal have a predetermined relationship.

Embodiments include the above and further include wherein the converter includes a digital-to-analog converter.

Embodiments include the above and further include wherein the converter includes an analog-to-digital converter.

According to embodiments, a test apparatus for testing a device under test includes a processor configured to provide a synchronizing clock signal, a converter configured to convert a signal data between digital and analog formats using a converter clock signal, a phase comparator configured to determine a phase relationship between the synchronizing and converter clock signals, a digital signal processor coupled to the phase comparator and configured to receive an information about the phase relationship, wherein the digital signal processor is configured to apply a delay to the signal data exchanged between the processor and the converter, based on the phase relationship. There is a predetermined frequency relationship between the synchronizing clock signal and the converter clock signal.

Embodiments include the above and further include wherein the processor is configured to perform a test flow in synchronism with the synchronizing clock signal.

Embodiments include the above and further include wherein the converter is configured to provide an analog signal on the basis of input signal values to the device under test. The digital signal processor is configured to provide digital data on the basis of a digitized device-under-test signal obtained from the converter using the delay and to evaluate the digital data.

According to embodiments, a method for converting a signal between digital and analog formats in a burst mode includes receiving a synchronizing clock signal provided from a processor and receiving a converter clock signal used by a converter, determining a phase relationship between the synchronizing clock signal and the converter clock signal, and applying a delay to a signal data exchanged between the processor and the converter based on the phase relationship between the synchronizing clock signal and the converter clock signal. The synchronizing clock signal and the converter clock signal share a predetermined frequency relationship.

Embodiments include the above and further include selecting, based on the phase relationship between the synchronizing clock signal and the converter clock signal, between operating in a first mode, where the enable signal triggering a conversion of data between digital and analog, which is in temporal synchronism with the synchronization clock signal, is sampled at edges of a first edge type of the converter clock signal, to obtain an intermediate signal, and in which the intermediate signal is sampled at edges of a second edge type of the converter clock signal, to obtain the enable signal which is in temporal synchronism with the converter clock signal, and a second mode, wherein the enable signal triggering a conversion of data between digital and analog, which is in temporal synchronism with the synchronization clock includes, is sampled at edges of the second edge type of the converter clock includes, to obtain the enable signal which is in temporal synchronism with the converter clock includes, and providing the signal data associated with the sampled enable signal to the converter.

According to embodiments, an article of manufacture including a computer readable medium having instructions stored thereon that, responsive to execution by an electronic system, cause the electronic system to perform operations including selecting, based on a phase relationship between a synchronizing clock signal and a converter clock signal, between operating in a first mode, in which an enable signal triggering a conversion of data between digital and analog formats, which is in temporal synchronism with the synchronization clock signal, is sampled at edges of a first edge type of the converter clock signal, to obtain an intermediate signal, and in which the intermediate signal is sampled at edges of a second edge type of the converter clock signal, to obtain the enable signal which is in temporal synchronism with the converter clock signal, and a second mode, in which the enable signal triggering a conversion of data between digital and analog formats, which is in temporal synchronism with the synchronization clock signal, is sampled at edges of the second edge type of the converter clock signal, to obtain the enable signal which is in temporal synchronism with the converter clock signal, and providing the signal data associated with the sampled enable signal to a converter.

BRIEF DESCRIPTION OF THE FIGURES

In the followings, embodiments of the present application are described in more detail with reference to the figures in which.

DETAILED DESCRIPTION OF THE EMBODIMENTS

The following description sets forth specific details such as particular embodiments, procedures, techniques etc. for purpose of explanation and not limitation. It will be appreciated by those skilled in the art that other embodiments may be employed apart from these specific details. For example, although the following description is facilitated using non-limiting example applications, the technology may be employed to any type of converters. In some instances, detailed description of well-known methods, interfaces, circuits and devices are omitted so as not to obscure the description with unnecessary detail.

Equal or equivalent elements with equal or equivalent functionality are denoted in the following description by equal or equivalent reference signs.

Figure 1:
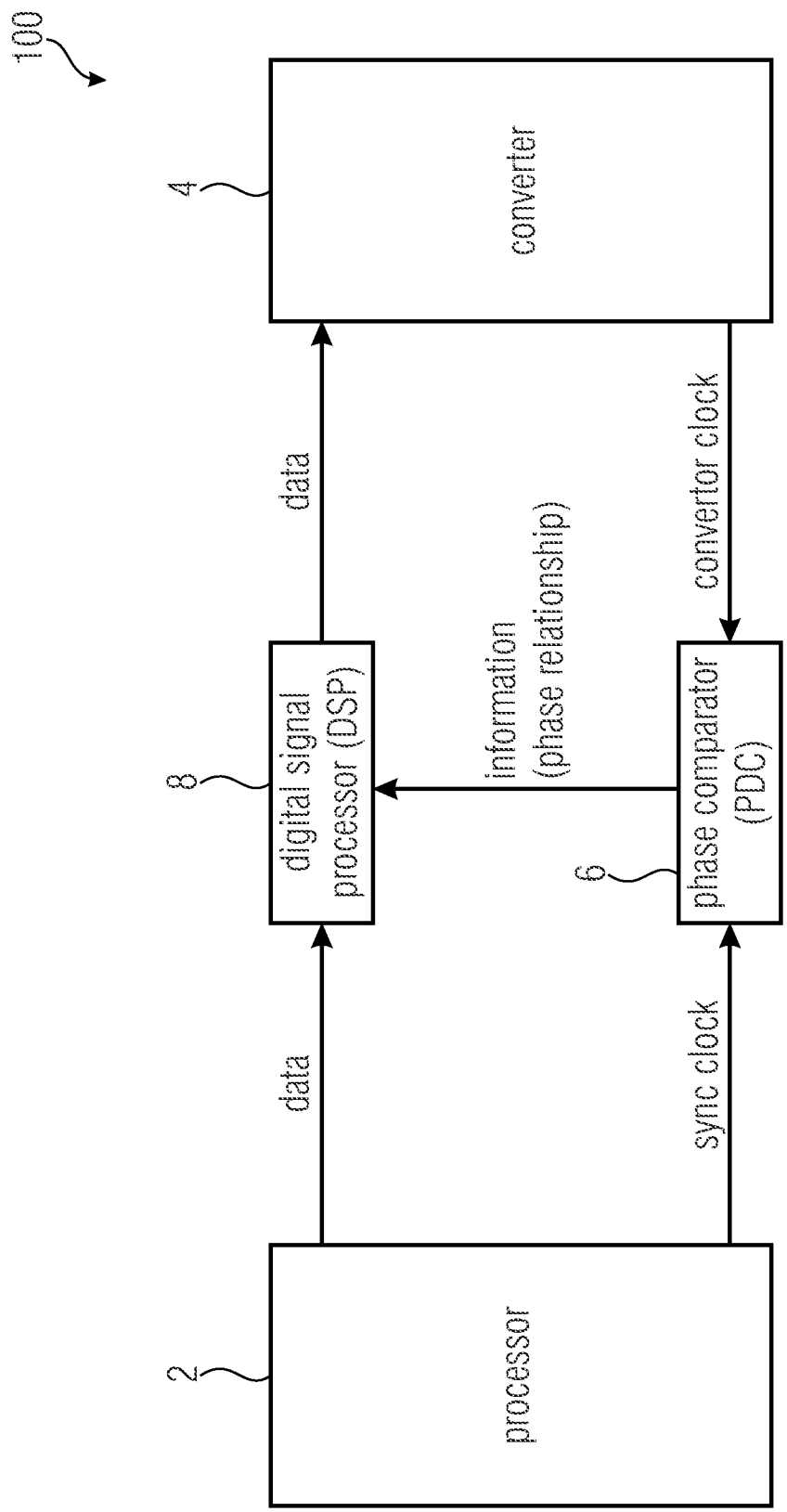
FIG. 1 shows a schematic block diagram of a circuit for converting a signal according to a first embodiment of the present invention of the present application.

FIG. 1 shows a schematic block diagram of a circuit for converting a signal according to a first embodiment of the present invention. A circuit 100 comprises a processor 2, a converter 4, a phase comparator, PDC, 6 and digital signal processor, DSP, 8.

The processor 2 is coupled to the PDC 6 and provides a synchronizing clock signal to the PDC 6. In addition, the processor 2 is coupled to the DSP 8 and provides a data/signal data to the DSP 8. The processor 2 is configured to provide or use a synchronizing clock signal, e.g. which is a clock signal to indicate a timing for outputting a data based on an input data value associated with a sample time on a time grid or time axis, e.g. equally spaced in terms of time. In this embodiment, it is depicted that the synchronizing clock signal is provided from the processor 2 to the PDC 6. However, the synchronizing clock signal may be provided to the processor 2 from another data source. In this case, the processer 2 uses the provided synchronizing clock signal.

The converter 4 is coupled to the PDC 6 and provides converter clock signal to the PDC 6. In addition, the converter 4 is coupled to the DSP 8 and receives signal data via the DSP 8 provided by the processor 2. The converter 4 is configured to convert a data between digital and analog using a converter clock signal, e.g. which is a clock signal to indicate a timing for receiving a data provided from the processor and/or define a time when conversion between digital and analog is executed. The converter 4 is a digital-to-analog or an analog-to-digital converter.

The PDC 6 is coupled to the processor 2 to receive the synchronizing clock signal, and coupled to the converter 4 to receive the converter clock signal and the PDC 6 is configured to perform comparison of timing of a rising edge or a falling edge between the synchronizing clock signal and the converter clock signal, thereby performing phase comparison between the signals. For example, the PDC 6 detects the phase difference between the synchronizing clock signal and the convert clock signal. In addition, the PDC 6 comprises a phase-to-digital converter, wherein the phase-to-digital converter is configured to measure a phase difference between the synchronizing clock signal and the converter clock signal for determining the phase relationship.

The DSP 8 is coupled to the PDC 6 to receive an information about the phase relationship, e.g. phase difference between the synchronizing clock signal and the converter clock signal, and the DSP 8 is configured to apply a delay to a signal data, e.g. time discrete output value associated with a different sample time, e.g. not on the original time grid or time axis, exchanged between the processor and the converter, e.g. in order to at least partially compensates for a phase difference between the synchronizing clock signal and the converter clock signal, in dependence of the phase relationship, wherein there is a predetermined frequency relationship between the synchronizing clock signal and the converter clock signal, e.g. which is locked at the predetermined value. Furthermore, the DSP 8 is configured to counteract and/or at least partially compensate a phase difference between the synchronizing clock signal and the converter clock signal.

In the circuit 100, there is a predetermined frequency relationship between the synchronizing clock signal and the converter clock signal, e.g. is locked at the predetermined value. The predetermined frequency relationship is defined based on the required result or running condition of the circuit or any other criteria.

As described above, the processor 2 provides the signal data to the DSP 8 and the synchronizing clock signal to the PDC 6. The PDC 6 receives the converter clock signal from the converter 4 and determines a phase relationship between the synchronizing clock signal and the converter clock signal. Information about the determined phase relationship is provided from the PDC 6 to the DSP 8. Then, the DSP 8 applies a delay to the signal data exchanged between the processor 2 and the converter 4, in dependence of the phase relationship. Hence, the output timing difference cause by the fact that the converter clock signal is phase shifted against the synchronizing clock signal is corrected at the converter 4.

Figure 2:
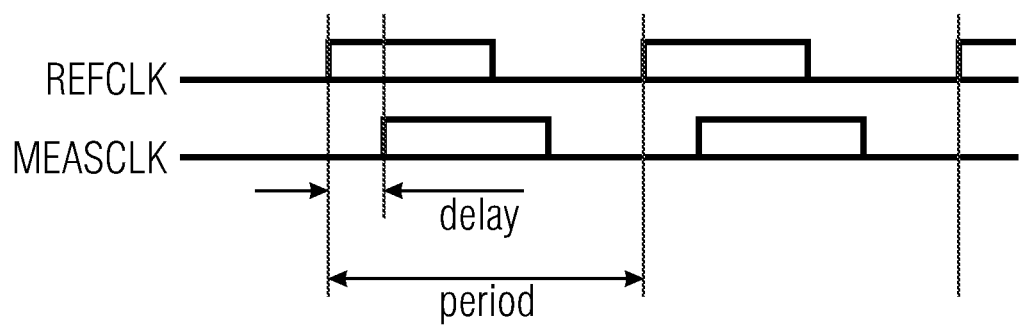
FIG. 2 shows a schematic timing diagram of a phase comparator according to the first embodiment of the present invention of the present application.
Figure 3:
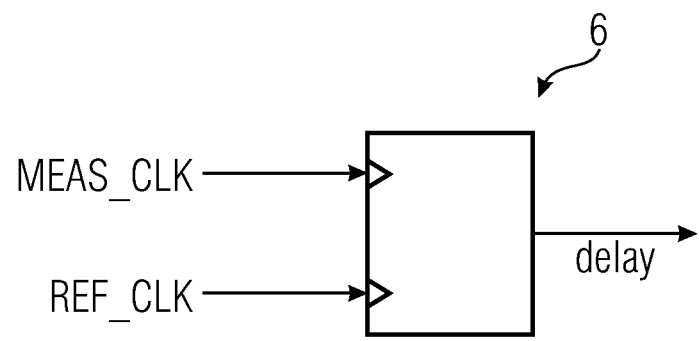
FIG. 3 shows a schematic block diagram of the phase comparator according to FIG. 2 in accordance with the present invention concept of the present application.

FIG. 2 shows a schematic timing diagram of the PDC 6 and FIG. 3 shows a schematic block diagram of the PDC 6. As shown in FIGS. 2 and 3, a reference clock signal REFCLK/REF_CLK and a measurement clock signal MEAS_CLK are provided to the PDC 6. Then, the PDC 6 delivers the delay between rising REF_CLK edge, e.g. rising edge of the reference clock signal, to rising MEAS_CLK edge, e.g., the rising edge of the measurement clock signal. As described above, the PDC 6 determines the phase difference, e.g. delay of the signal, for example, the accuracy of the PDC 6 is directly influencing the timing accuracy of the circuit. Hence, the PDC 6 is required to be accurate.

Figure 4:
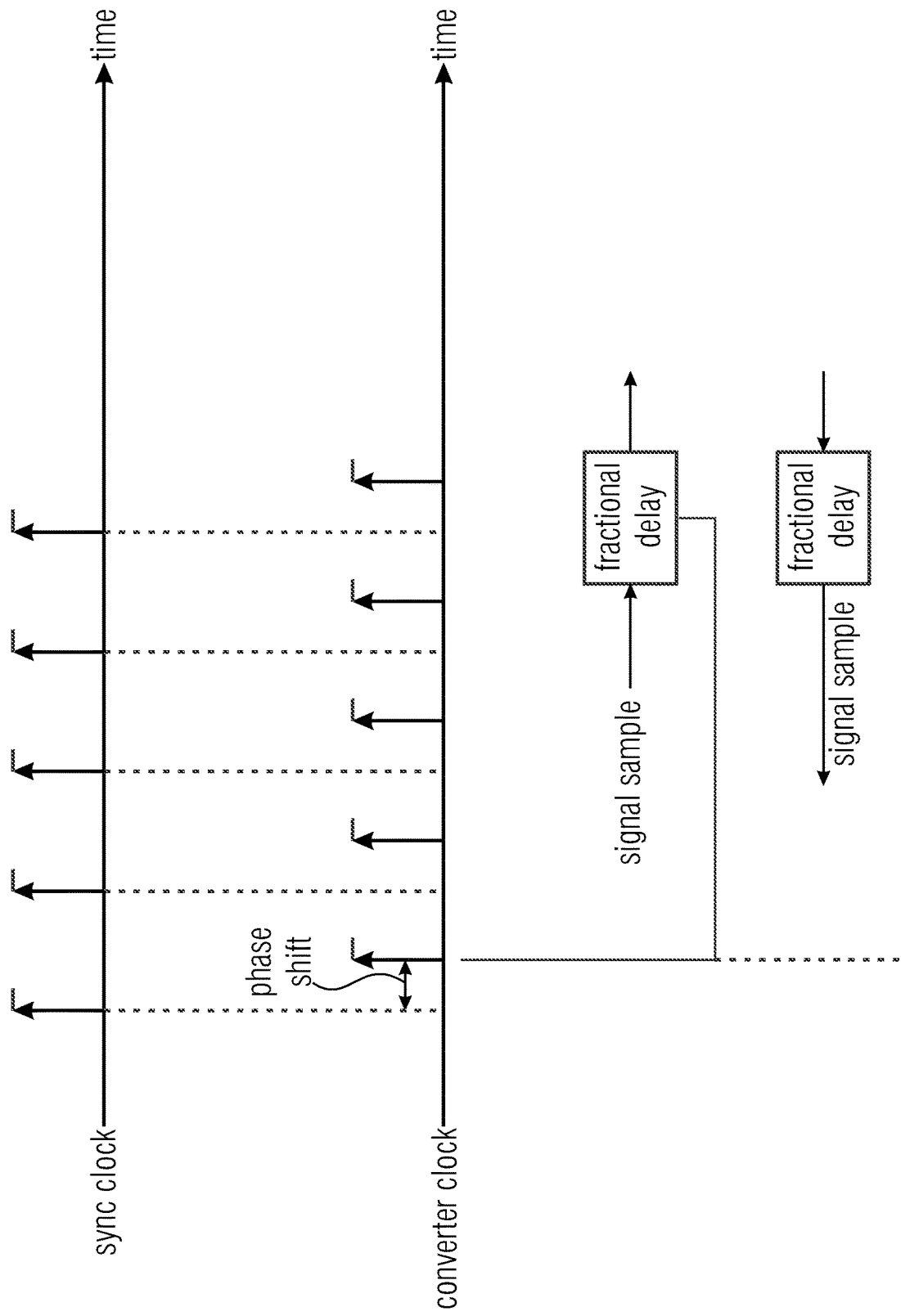
FIG. 4 shows a schematic illustration indicating the phase relationship between the synchronizing clock and the converter clock according to the first embodiment of the present invention concept of the present application.

FIG. 4 shows a schematic illustration indicating the phase relationship between the synchronizing clock signal and the converter clock signal. The DSP 8, or as shown in FIG. 4, e.g. the fractional delay filtering which is included in the DSP 8, is configured to provide a filtered data value (signal sample) associated with a conversion time in a time grid determined by the converter clock signal, which is actually digital-to-analog converted by the converter at a time determined by the converter clock signal, on the basis of one or more input data values provided in synchronism with the synchronizing clock signal, e.g. one or more signal samples provided by the processor 2 which should be digital-to-analog converted at times determined by the synchronizing clock signal, which is, not possible due to the time shift/phase shift between the synchronizing clock signal and the converter clock signal and/or the DSP 8 or the fractional delay filtering, is configured to provide filtered data values aligned to a time axis determined by the synchronizing clock signal on the basis of one or more data values defined in a time grid determined by the converter clock signal, e.g. one or more signal samples which have actually been analog-to-digital converted by the converter at times determined by the converter clock signal, but which should have been analog-to-digital converted at times determined by the synchronizing clock signal, which is, however, not possible due to the time shift/phase shift between the synchronizing clock signal an the converter clock signal.

In addition, the PDC 6 is possible to be integrated into standard CMOS process, and therefore, it allows higher density when compared to the case of PLL approach in the known art. Furthermore, one central clock generation for all converter clocks, and hence, it allows also higher density. Another advantage is that usable PDC measurements are available in a time much shorter than the typical settling times of low phase noise PLLs.

Figure 5:
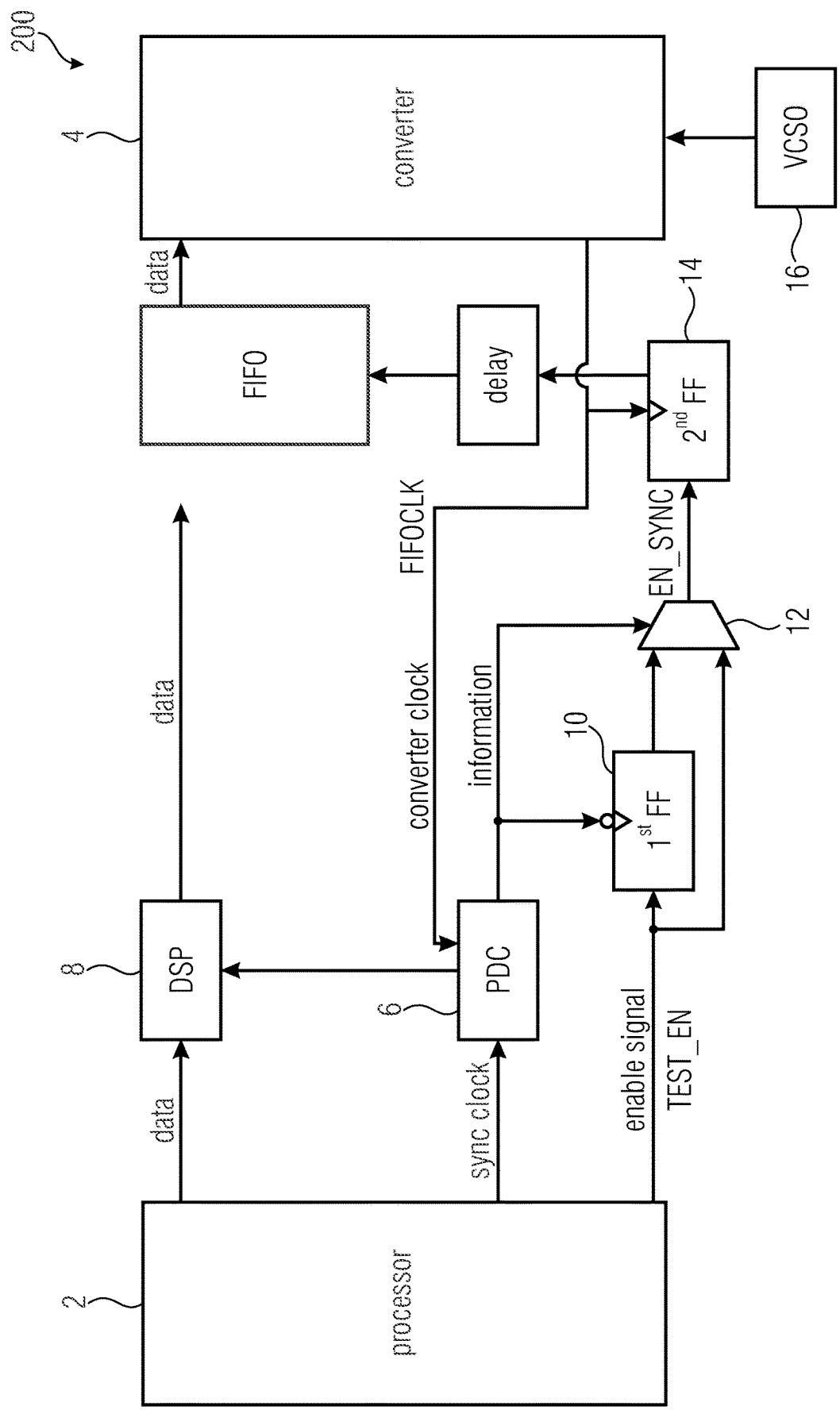
FIG. 5 shows a schematic block diagram indicating an implementation example of the circuit according to a second embodiment of the present invention of the present application.

FIG. 5 shows a schematic block diagram indicating an implementation of the circuit 200 according to a second embodiment of the present invention. As shown in FIG. 5, the circuit 200 further comprises a first flip-flop circuit, FF, 10, a signal selector, e.g. multiplexer 12, a second flip-flop circuit, FF, 14 and an oscillator, VCSO (voltage controlled SAW oscillator, SAW=surface acoustic wave), 16. In addition, the DSP 8 comprises a fractional delay filter, which can be implemented with a Farrow structure or use any other appropriate implementation.

The first FF10 is coupled to the processor 2 for receiving an enable signal, TEST_EN, e.g. which is a test signal on the different clock domain as the converter clock signal and provided from the processor for aligning the output timing of the signal data, wherein the FF 10 is configured to sample the enable signal at a first sampling phase, when the phase relationship indicates that a value of a phase difference between the synchronizing clock signal and the converter clock signal is in a first predetermined range, e.g. smaller than a predetermined value, in case the phase difference has a potential risk to lead metastability, the phase of sampling the enable signal is inverted to move sampling time instances away from clock edges of the synchronization clock signal, to obtain a sampled signal. The predetermined range is determined, for example, based on the required accuracy of the test.

The signal selector, e.g., multiplexer 12 is coupled to the processor 2 for receiving the enable signal TEST_EN and coupled to the first FF 10 to receive the sampled signal, wherein the multiplexer 12 is configured to select one of the received signals, e.g. in dependence on the phase relationship, to obtain a selected signal, EN_SYNC. The multiplexer 12 selects one of input signals based on the information about the phase relationship.

The second FF 14 is coupled to the multiplexer 12 for receiving the selected signal EN_SYNC, wherein the second FF14 is configured to sample the enable signal TEST_EN at a second sampling phase, when the phase relationship is in a second predetermined range, e.g. which is different from the first predetermined range and typically non-overlapping with the first predetermined range, and which may, for example, indicate that a value of a phase difference between the synchronizing clock signal and the converter clock signal is larger than a predetermined value; in this case, the edge of the sampled signal is synchronized with the converter clock signal, e.g. output timing of the signals are aligned and therefore, it is not necessary to align the rising timing of the clock signal.

In FIG. 4, it is depicted that the phase difference is determined based on the rising edge, however, as described, the circuit 200 is possible to select falling edges. For example, the circuit 200 is configured to select, in dependence on the information about the phase relationship between the synchronizing clock signal and the converter clock signal, between a first mode, in which the enable signal triggering a conversion of data between digital and analog, which is in temporal synchronism with the synchronization clock signal, is sampled at edges of a first edge type, e.g. at falling edges, of the converter clock signal, to obtain an intermediate signal, and in which the intermediate signal is sampled at edges of a second edge type, e.g. rising edges, of the converter clock signal, to obtain the enable signal which is in temporal synchronism with the converter clock signal, and a second mode, in which the enable signal triggering a conversion of data between digital and analog, which is in temporal synchronism with the synchronization clock signal, is sampled at edges of the second edge type of the converter clock signal, to obtain the enable signal which is in temporal synchronism with the converter clock.

The VCSO 16 is coupled to the converter 4. An output signal of the VCSO 16 is used as the converter clock signal. The circuit 200 is configured to derive the synchronizing clock signal and the converter clock signal from a common reference signal, such that frequencies of the synchronizing clock signal and of the converter clock signal are in a predetermined relationship. In addition, the circuit 200 may be configured to derive the converter clock signal from the output signal of the VCSO 16.

In addition, as shown in FIG. 5, a first-in-first-out circuit FIFO is coupled to the DSP 8 for receiving the signal data, and coupled to the second FF 14 via an additional Delay circuit ("Delay N") for example used to delay the output signal of FF 14 by a programmable number of target clock signal cycles. The number of clock cycles is chosen in a way that the FIFO enable signal READ_EN is becoming active exactly at the correct point in time when enough data is available in the FIFO and the device under test is supposed to receive the data via the DAC, wherein the FIFO provides signal data associated with the sampled enable signal to the converter 4.

Furthermore, as shown in FIG. 5, the circuit 200 is configured to decide, on the basis of an information about the phase relationship between the synchronizing clock signal and the converter clock signal, whether an enable signal triggering a conversion of data between digital and analog, which is in temporal synchronism with the synchronization clock signal, is sampled at a rising edge or at a falling edge of the converter clock signal, in order to obtain an enable signal which is in temporal synchronism with the converter clock signal.

Figure 6:
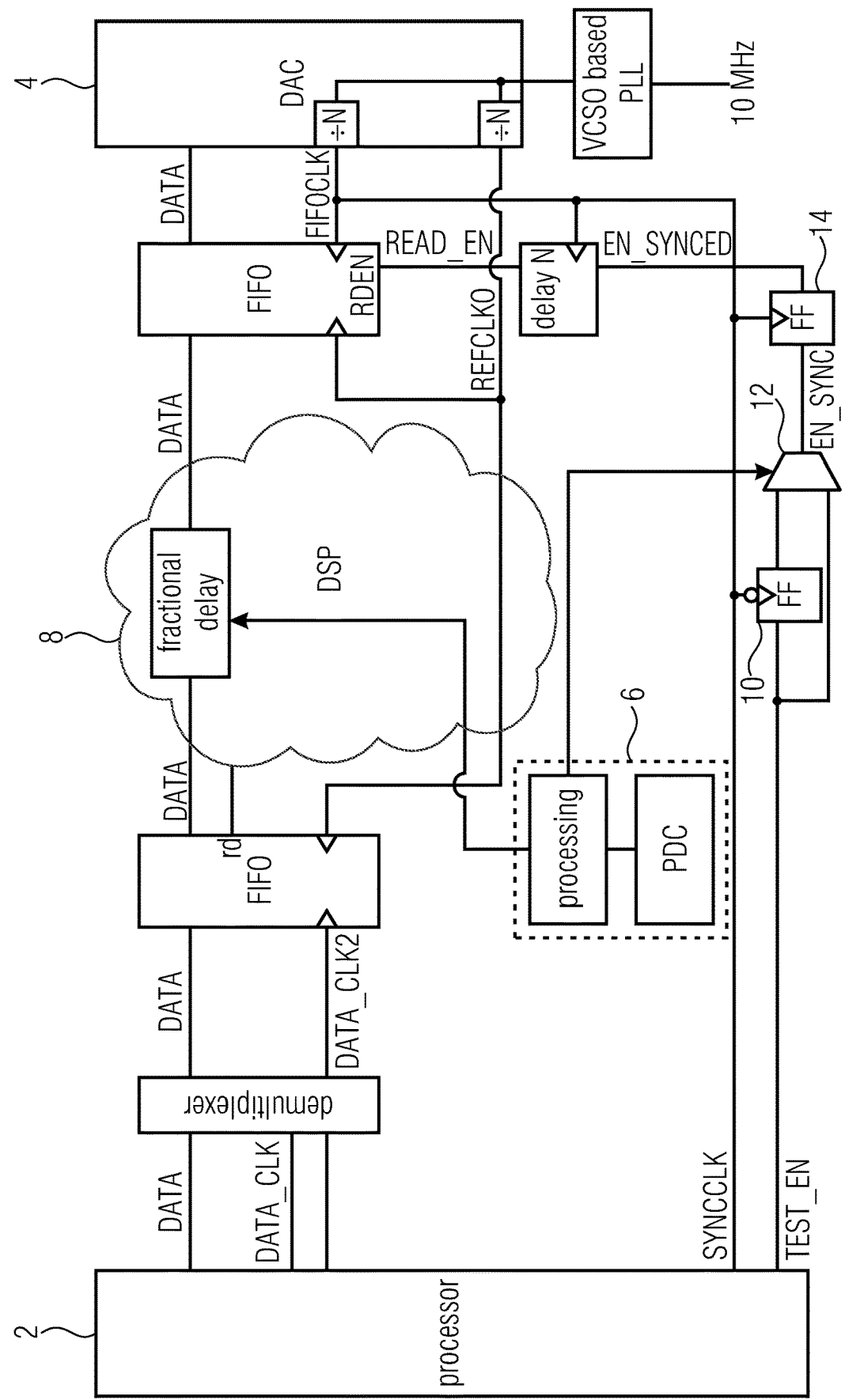
FIG. 6 shows a schematic block diagram indicating a test apparatus for testing a device under test according to a third embodiment of the present invention concept of the present application.

FIG. 6 shows a schematic block diagram indicating a test apparatus for testing a device under test according to a third embodiment of the present invention. In FIG. 6, the test apparatus including the circuit 200 according to the second embodiment, however, the test apparatus may include the circuit 100 according to the first embodiment. As indicated in FIG. 6, the PDC 6 further includes processing circuit to provide information regarding phase difference to the DSP 8 and the selector 12. The detailed explanation is omitted to avoid repeated explanation of the circuit of the present invention.

As shown in FIG. 6, in the test apparatus, beginning of the waveform is determined by signal (TEST_EN), e.g. start a test flow, e.g. a test flow using multiple channel modules providing signals to the device under test and evaluating signals received from a device under test, in synchronism with the synchronizing clock signal. Therefore, timing requirements at data interface is relatively relaxed.

In addition, the test apparatus, e.g. the circuit 200, is configured to provide an analog signal obtained using the converter 4 on the basis of input signal values, e.g. provided by the processor 2, to the device under test, e.g. thereby stimulate the device under test, and/or wherein the apparatus is configured to obtain digital data provided by the DSP 8 on the basis of a digitized device-under-test signal obtained from the converter 4 using the delay and to evaluate the digital data, e.g. to characterize the device under test.

Figure 7:
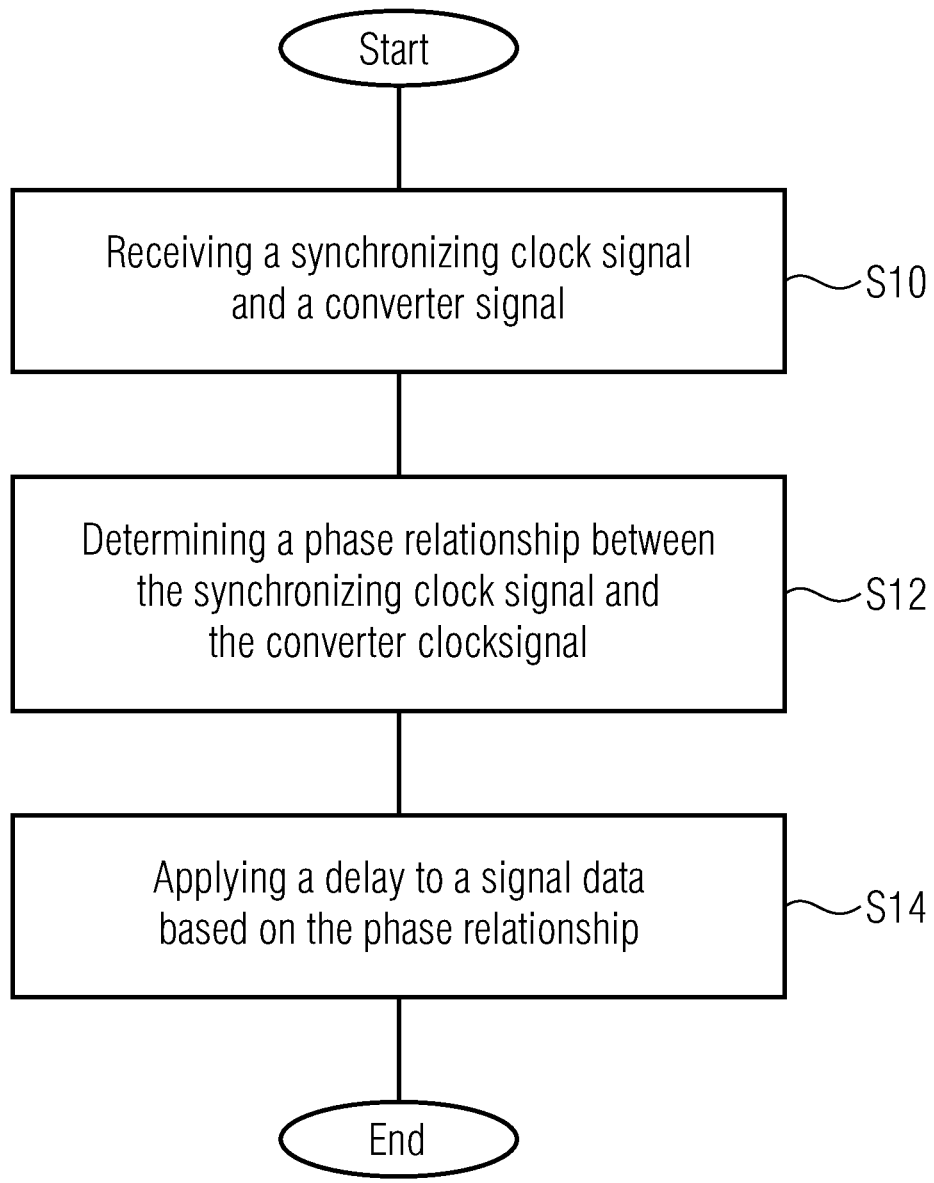
FIG. 7 shows a flowchart indicating steps of a method for converting a signal between digital and analog according to a third embodiment of the present invention concept of the present application.
Figure 8:
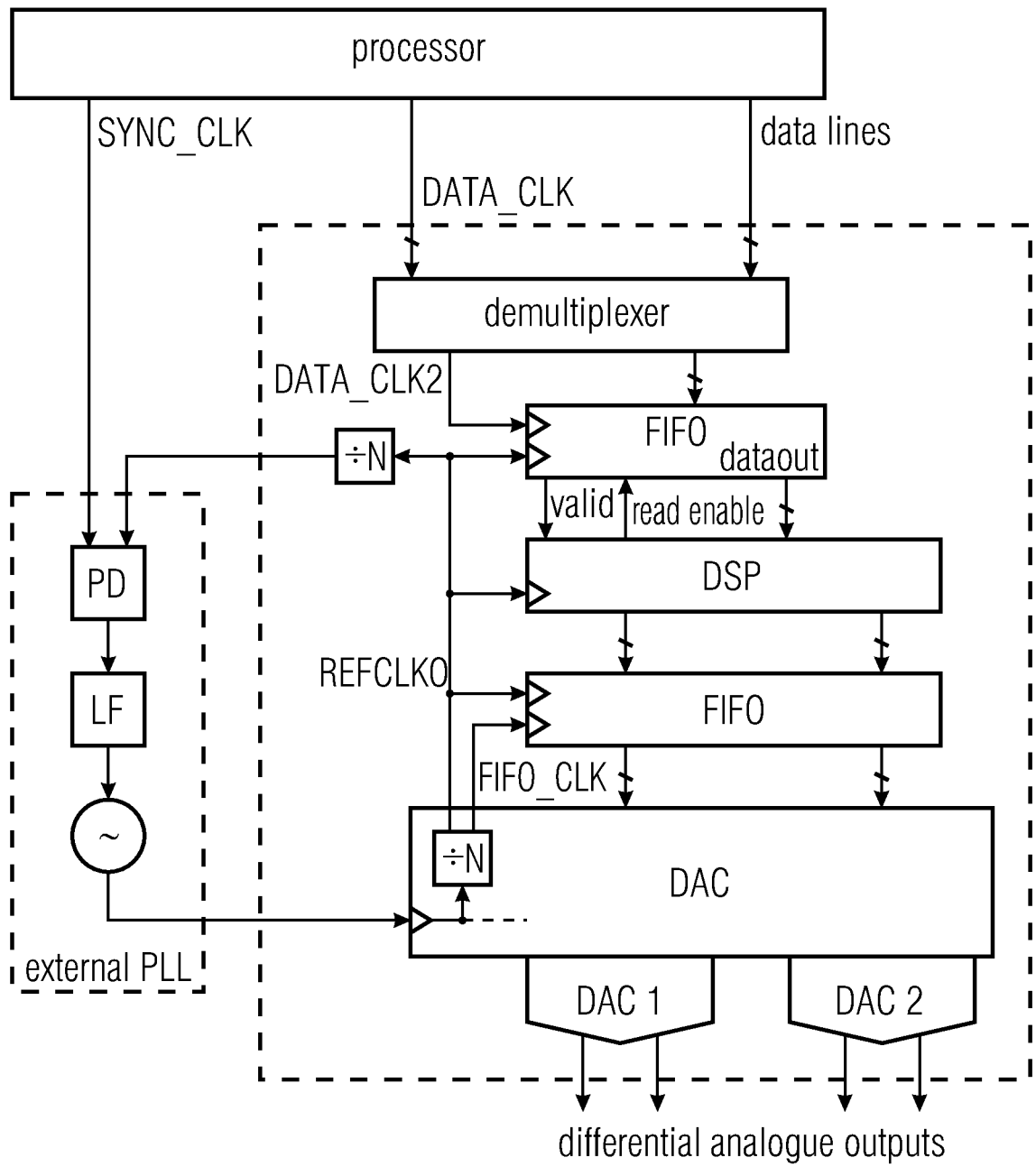
FIG. 8 shows a schematic block diagram according to a prior art.
Figure 9:
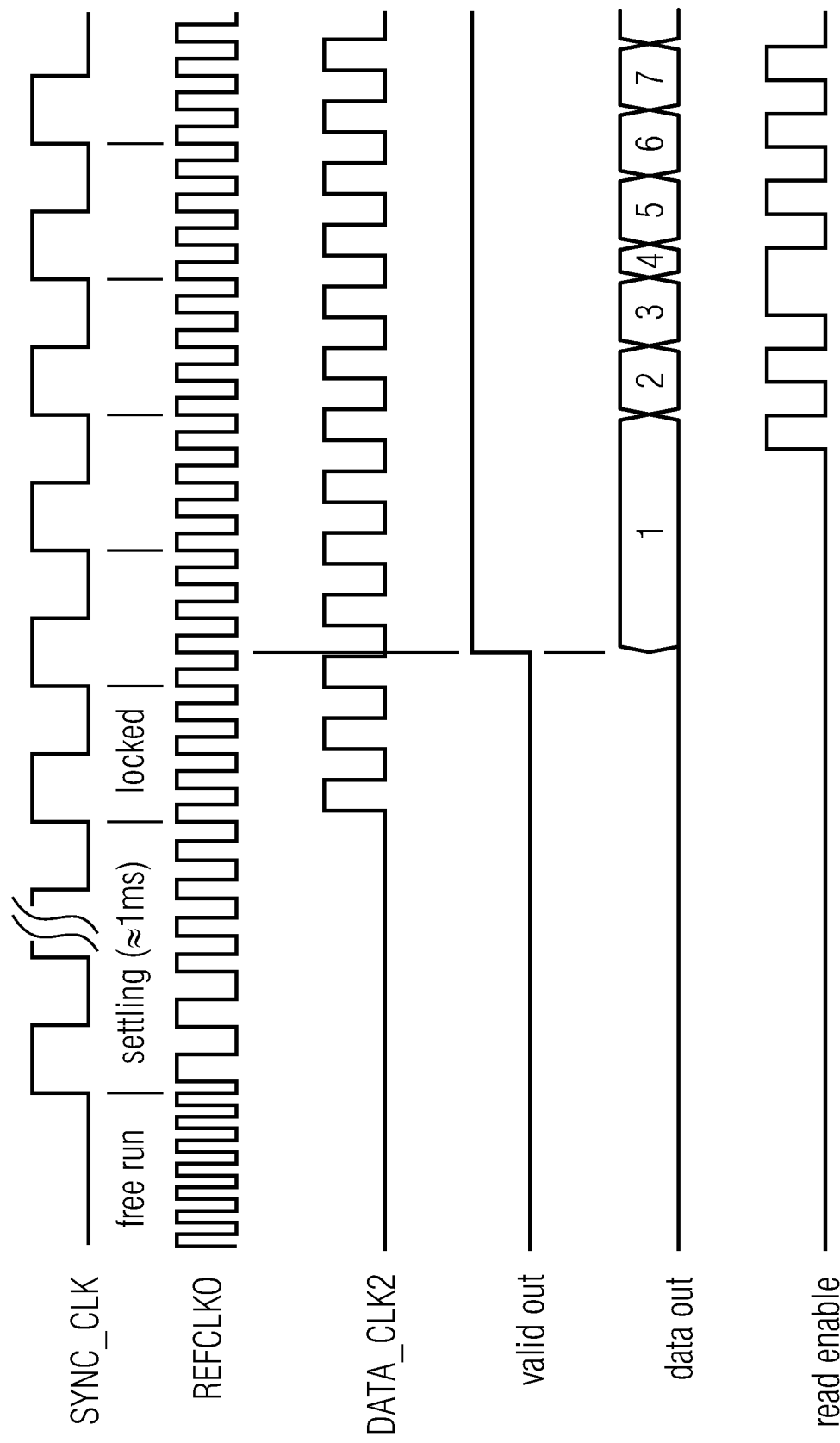
FIG. 9 shows a schematic timing diagram according to a prior art.

FIG. 7 shows a flowchart indicating steps of a method for converting a signal between digital and analog according to a third embodiment of the present invention concept.

At the first, receiving a synchronizing clock signal and a converter clock signal (S10). For example, a phase comparator, e.g. the PDC 6 as shown in FIG. 1 or FIG. 2, for instance, receives the synchronizing clock signal from a processor, e.g. the processor 2 in FIG. 1 or FIG. 2, for instance, and the converter clock signal from the converter, e.g. the converter 4 in FIG. 1 or FIG. 2, for instance. The synchronizing clock may be provided by the processor 2 or by any other source.

Next, determining a phase relationship between the synchronizing clock signal and the converter clock signal (S12).

Then, applying a delay to a signal data based on the phase relationship (S14). For example, applying a delay to a signal data exchanged between the processor and the converter based on the determined phase relationship between the synchronizing clock signal and the converter clock signal in step S12. In addition, there is a predetermined frequency relationship between the synchronizing clock signal and the converter clock signal.

Further to the steps mentioned above, it is possible to select a sampling edge mode. For example, the method further comprises a step to select the sampling edge mode, e.g. selecting between a first mode and a second mode in dependence on the determined phase relationship between the synchronizing clock signal and the converter clock signal. In the first mode, an enable signal, which is in temporal synchronism with the synchronization clock, is sampled at edges of a first edge type, e.g. at a falling edge, of the converter clock signal to obtain an intermediate signal and in which the intermediate signal is sampled at edge of a second edge type, e.g. rising edge, of the converter clock, to obtain the enable signal which is in temporal synchronism with the converter clock. In the second mode, the enable signal, which is in temporal synchronism with the synchronization clock, is sampled at edges of the second edge type, e.g. at the rising edge, to obtain the enable signal, which is in temporal synchronism with the converter clock. Then, the signal data associated with the sampled enable signal is provided to the converter, e.g. the converter 4 in FIG. 1 or FIG. 2.

According to a fourth aspect of the present application, computer program is provided, wherein the computer program is configured to implement the above described method, when being executed on a computer or micro controller, so that the above described method is implemented by the computer program.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

The inventive data stream can be stored on a digital storage medium or can be transmitted on a transmission medium such as a wireless transmission medium or a wired transmission medium such as the Internet.

Depending on certain implementation requirements, embodiments of the application can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present application can be implemented as a computer program product with a program code, the program code being operative for performing one of the methods when the computer program product runs on a computer. The program code may, for example, be stored on a machine readable carrier.

Other embodiments comprise a computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may, for example, be configured to be transferred via a data communication connection, for example via the internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The above described embodiments are merely illustrative for the principles of the present invention. It is understood that modifications and variations of the arrangements and the details description herein will be apparent to others skilled in the art. It is the intent, therefore, to be limited only by the scope of the impending patent claims and not by the specific details presented by way of description and explanation of the embodiments herein.

We claim:

1. An electronic circuit for converting a signal between digital and analog in a burst mode, the electronic circuit comprising:

a processor configured to utilize a synchronizing clock signal;

a converter configured to convert a signal data between digital and analog using a converter clock signal;

a phase comparator configured to determine a phase relationship between the synchronizing clock signal and the converter clock signal; and a digital signal processor coupled to the phase comparator and configured to receive an information about the phase relationship, wherein the digital signal processor is configured to apply a delay to the signal data being exchanged between the processor and the converter, wherein the delay is in dependence of the phase relationship, and wherein the synchronizing clock signal and the converter clock signal have a predetermined frequency relationship.

2. The electronic circuit according to claim 1, wherein the converter is configured to determine, on a basis of the information about the phase relationship between the synchronizing and converter clock signals, on which edge an enable signal is sampled that triggers a conversion of data between digital and analog, which is in temporal synchronism with the synchronizing clock signal, as between at a rising edge and a falling edge of the converter clock signal, in order to obtain the enable signal which is in temporal synchronism with the converter clock signal.

3. The electronic circuit according to claim 2, wherein the converter is configured to select, based on the information about the phase relationship between the synchronizing clock signal and the converter clock signal, between operation in: a first mode, in which the enable signal triggering a conversion of data between digital and analog, which is in temporal synchronism with the synchronizing clock signal, is sampled at edges of a first edge type of the converter clock signal, to obtain an intermediate signal, and in which the intermediate signal is sampled at edges of a second edge type of the converter clock signal, to obtain the enable signal which is in temporal synchronism with the converter clock signal; and a second mode, in which the enable signal triggering a conversion of data between digital and analog, which is in temporal synchronism with the synchronizing clock signal, is sampled at edges of the second edge type of the converter clock signal, to obtain the enable signal which is in temporal synchronism with the converter clock signal.

4. The electronic circuit according to claim 1, further comprising:

a first flip-flop circuit coupled to the processor and configured to receive an enable signal, wherein the first flip-flop circuit is configured to sample the enable signal at a first sampling phase, wherein the phase relationship indicates that a value of a phase difference between the synchronizing and converter clock signals are in a first predetermined range, to obtain a sampled signal;

a signal selector coupled to the digital signal processor and configured to receive the enable signal and further coupled to the first flip-flop circuit to receive the sampled signal, wherein the signal selector is configured to select one of the enable signal and the sampled signal to obtain a selected signal;

a second flip-flop circuit coupled to the signal selector and configured to receive the selected signal, wherein the second flip-flop circuit is configured to sample the enable signal at a second sampling phase, wherein the phase relationship is in a second predetermined range; and a first-in-first-out circuit coupled to the digital signal processor to receive the signal data, and coupled to the second flip-flop circuit via a delay circuit to receive a delayed version of an output signal of the second flip-flop circuit, and wherein the first-in-first-out circuit is operable to provide a signal data associated with the sampled enable signal to the converter.

5. The electronic circuit according to claim 4, wherein the signal selector comprises a multiplexer, configured to select one of the enable signal and the sampled signal based on the information about the phase relationship.

6. The electronic circuit according to claim 1, wherein the phase comparator comprises a phase-to-digital converter, and wherein the phase-to-digital converter is configured to measure a phase difference between the synchronizing clock signal and the converter clock signal for determining the phase relationship.

7. The electronic circuit according to claim 1, wherein the digital signal processor is configured to counteract and at least partially compensate for a phase difference between the synchronizing clock signal and the converter clock signal.

8. The electronic circuit according to claim 7, wherein the digital signal processor is configured to provide a filtered data value associated with a conversion time in a time scale determined by the converter clock signal based on one or more input data values provided in synchronism with the synchronizing clock signal, and wherein the digital signal processor is configured to provide filtered data values aligned to a time scale determined by the synchronizing clock signal on based on one or more data values defined in a time scale determined by the converter clock signal.

9. The electronic circuit according to claim 7, wherein the digital signal processor comprises a finite impulse response (FIR) filter.

10. The electronic circuit according to claim 7, wherein the digital signal processor comprises a Farrow structure.

11. The electronic circuit according to claim 1 further comprising:

an oscillator, wherein the converter clock signal is derived from an output signal of the oscillator.

12. The electronic circuit according to claim 1, wherein the synchronizing clock signal and the converter clock signal are derived from a common reference signal, wherein frequencies of the synchronizing clock signal and of the converter clock signal have a predetermined relationship.

13. The electronic circuit according to claim 1, wherein the converter comprises a digital-to-analog converter.

14. The electronic circuit according to claim 1, wherein the converter comprises an analog-to-digital converter.

15. A test apparatus for testing a device under test, the test apparatus comprising:

a processor configured to provide a synchronizing clock signal;

a converter configured to convert a signal data between digital and analog formats using a converter clock signal;

a phase comparator configured to determine a phase relationship between the synchronizing and converter clock signals;

a digital signal processor coupled to the phase comparator and configured to receive an information about the phase relationship, wherein the digital signal processor is configured to apply a delay to the signal data exchanged between the processor and the converter, based on the phase relationship, and wherein there is a predetermined frequency relationship between the synchronizing clock signal and the converter clock signal.

16. The test apparatus according to claim 15, wherein the processor is configured to perform a test flow in synchronism with the synchronizing clock signal.

17. The test apparatus according to claim 16, wherein the converter is configured to provide an analog signal based on input signal values to the device under test, and wherein the digital signal processor is configured to provide digital data based on a digitized device-under-test signal obtained from the converter using the delay and to evaluate the digital data.

18. A method for converting a signal between digital and analog formats in a burst mode, the method comprising:

receiving a synchronizing clock signal provided from a processor and receiving a converter clock signal used by a converter;

determining a phase relationship between the synchronizing clock signal and the converter clock signal; and applying a delay to a signal data exchanged between the processor and the converter based on the phase relationship between the synchronizing clock signal and the converter clock signal, and wherein the synchronizing clock signal and the converter clock signal share a predetermined frequency relationship.

19. The method according to claim 18 further comprising:

selecting, based on the phase relationship between the synchronizing clock signal and the converter clock signal, between operating in:

a first mode, where an enable signal triggering a conversion of data between digital and analog, which is in temporal synchronism with the synchronizing clock signal, is sampled at edges of a first edge type of the converter clock signal, to obtain an intermediate signal, and in which the intermediate signal is sampled at edges of a second edge type of the converter clock signal, to obtain the enable signal which is in temporal synchronism with the converter clock signal, and a second mode, wherein the enable signal triggers a conversion of data between digital and analog, which is in temporal synchronism with the synchronizing clock signal, is sampled at edges of the second edge type of the converter clock signal, to obtain the enable signal which is in temporal synchronism with the converter clock signal; and providing a signal data associated with a sampled enable signal to the converter.

20. An article of manufacture including a computer readable medium having instructions stored thereon that, responsive to execution by an electronic system, cause said electronic system to perform operations comprising:

selecting, based on a phase relationship between a synchronizing clock signal and a converter clock signal, between operating in:

a first mode, in which an enable signal triggering a conversion of data between digital and analog formats, which is in temporal synchronism with the synchronizing clock signal, is sampled at edges of a first edge type of the converter clock signal, to obtain an intermediate signal, and in which the intermediate signal is sampled at edges of a second edge type of the converter clock signal, to obtain the enable signal which is in temporal synchronism with the converter clock signal, and a second mode, in which the enable signal triggering a conversion of data between digital and analog formats, which is in temporal synchronism with the synchronizing clock signal, is sampled at edges of the second edge type of the converter clock signal, to obtain the enable signal which is in temporal synchronism with the converter clock signal; and providing the signal data associated with the sampled enable signal to a converter.

* * * * *